United States Patent
Duboust et al.

(10) Patent No.: US 10,589,397 B2
(45) Date of Patent: Mar. 17, 2020

(54) ENDPOINT CONTROL OF MULTIPLE SUBSTRATE ZONES OF VARYING THICKNESS IN CHEMICAL MECHANICAL POLISHING

(71) Applicant: Applied Materials, Inc., Santa Clara, CA (US)

(72) Inventors: Alain Duboust, Sunnyvale, CA (US); Wen-Chiang Tu, Mountain View, CA (US); Shih-Haur Shen, Sunnyvale, CA (US); Jimin Zhang, San Jose, CA (US); Ingemar Carlsson, Milpitas, CA (US); Boguslaw A. Swedek, Cupertino, CA (US); Zhihong Wang, Santa Clara, CA (US); Stephen Jew, San Jose, CA (US); David H. Mai, Palo Alto, CA (US); Huyen Tran, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 254 days.

(21) Appl. No.: 15/424,670

(22) Filed: Feb. 3, 2017

(65) Prior Publication Data
US 2017/0151647 A1 Jun. 1, 2017

Related U.S. Application Data

(60) Continuation of application No. 14/246,801, filed on Apr. 7, 2014, now abandoned, which is a division of
(Continued)

(51) Int. Cl.
*B24B 37/013* (2012.01)
*B24B 37/04* (2012.01)
(Continued)

(52) U.S. Cl.
CPC .......... *B24B 37/013* (2013.01); *B24B 37/042* (2013.01); *B65B 1/366* (2013.01);
(Continued)

(58) Field of Classification Search
CPC ... G06F 17/5086; B65B 1/366; B24B 37/013; B24B 37/042; H01L 22/20; H01L 22/26; H01L 22/12
See application file for complete search history.

(56) References Cited

U.S. PATENT DOCUMENTS

| | | | |
|---|---|---|---|
| 5,961,373 | A | 10/1999 | Lai |
| 6,309,276 | B1 | 10/2001 | Tsai et al. |

(Continued)

FOREIGN PATENT DOCUMENTS

JP          10044028          2/1998

OTHER PUBLICATIONS

Korean Search Report & Written Opinion for Application No. PCT/US2011/046660, dated Mar. 22, 2012, 9 pages.
(Continued)

*Primary Examiner* — Nathan L Laughlin
(74) *Attorney, Agent, or Firm* — Fish & Richardson P.C.

(57) ABSTRACT

A difference between a first expected required polish time for a first substrate and a second expected required polish time for a second substrate is determined using a first pre-polish thickness and a second pre-polish thickness measured at an in-line metrology station. A duration of an initial period is determined based on the difference between the first expected required polish time and the second expected required polish time. For the initial period at a beginning of a polishing operation, no pressure is applied to whichever of the first substrate and the second substrate has a lesser expected required polish time while simultaneously pressure is applied to whichever of the first substrate and the second (Continued)

substrate has a greater expected required polish time. After the initial period, pressure is applied to both the first substrate and the second substrate.

16 Claims, 11 Drawing Sheets

Related U.S. Application Data application No. 12/871,714, filed on Aug. 30, 2010, now Pat. No. 8,694,144.

(51) Int. Cl.
*H01L 21/66* (2006.01)
*B65B 1/36* (2006.01)
*H01L 21/306* (2006.01)

(52) U.S. Cl.
CPC ........ *H01L 21/30625* (2013.01); *H01L 22/20* (2013.01); *H01L 22/26* (2013.01); *H01L 22/12* (2013.01)

(56) References Cited

U.S. PATENT DOCUMENTS

| | | | |
|---|---|---|---|
| 6,361,646 B1 | 3/2002 | Bibby et al. | |
| 6,594,542 B1 | 7/2003 | Williams | |
| 6,676,482 B2 | 1/2004 | Bibby et al. | |
| 6,939,198 B1 * | 9/2005 | Swedek | B24B 37/013 451/41 |
| 7,409,260 B2 | 8/2008 | David et al. | |
| 9,490,186 B2 | 11/2016 | Benvegnu et al. | |
| 2002/0151259 A1 | 10/2002 | Hirokawa et al. | |
| 2005/0112997 A1 | 5/2005 | Lin | |
| 2006/0246820 A1 | 11/2006 | Hofmann | |
| 2007/0243795 A1 | 10/2007 | Kobayashi | |
| 2009/0036026 A1 | 2/2009 | David et al. | |
| 2009/0061733 A1 | 3/2009 | Fujita et al. | |
| 2010/0056023 A1 | 3/2010 | David et al. | |
| 2010/0120330 A1 | 5/2010 | Zhang et al. | |
| 2010/0120331 A1 | 5/2010 | Carlsson et al. | |
| 2010/0129939 A1 | 5/2010 | David et al. | |
| 2010/0217430 A1 | 8/2010 | David et al. | |
| 2011/0104987 A1 | 5/2011 | David | |
| 2011/0256805 A1 | 10/2011 | David et al. | |
| 2011/0281501 A1 | 11/2011 | Qian | |
| 2011/0282477 A1 | 11/2011 | Lee et al. | |
| 2012/0026492 A1 | 2/2012 | Zhang | |
| 2012/0231701 A1 | 9/2012 | Qian et al. | |
| 2013/0237128 A1 | 9/2013 | David et al. | |
| 2013/0280827 A1 | 10/2013 | Benvegnu et al. | |
| 2013/0288572 A1 | 10/2013 | Benvegnu et al. | |
| 2016/0372388 A1 | 12/2016 | Benvegnu et al. | |

OTHER PUBLICATIONS

International Preliminary Report on Patentability and Written Opinion issued for International Application No. PCT/US2011-046660 dated Mar. 5, 2013; 6 pages.

International Search Report and Written Opinion in International Application No. PCT/US2014/065243, dated Feb. 16, 2015, 11 pages.

* cited by examiner

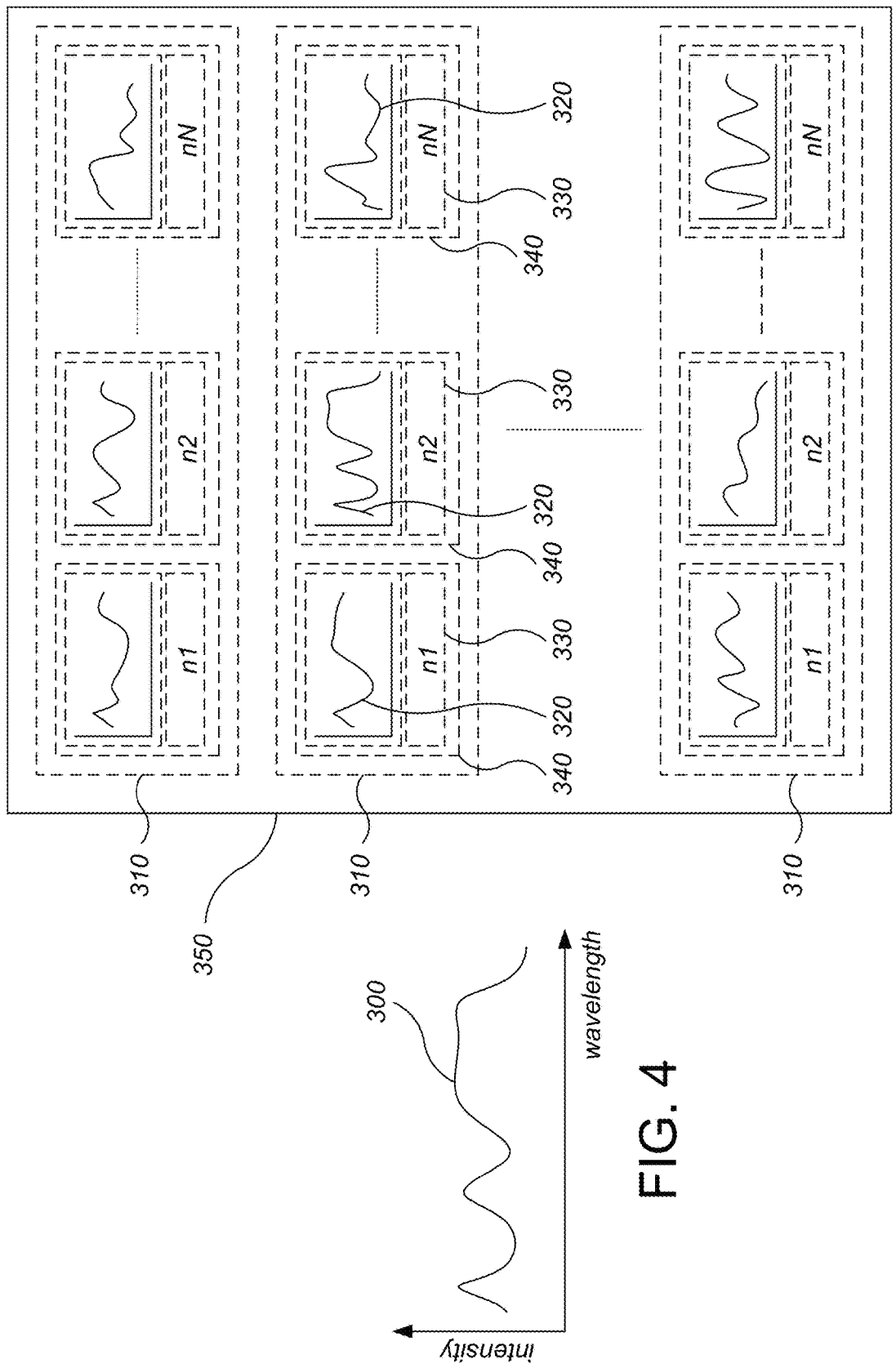

ENDPOINT CONTROL OF MULTIPLE SUBSTRATE ZONES OF VARYING THICKNESS IN CHEMICAL MECHANICAL POLISHING

CROSS REFERENCE TO RELATED APPLICATIONS

This application is a continuation of and claims priority to U.S. patent application Ser. No. 14/246,801, filed on Apr. 7, 2014, which is a divisional of and claims priority to U.S. patent application Ser. No. 12/871,714, filed on Aug. 30, 2010, the entire contents of both of which are hereby incorporated by reference.

TECHNICAL FIELD

The present disclosure relates generally to monitoring of multiple substrates during chemical mechanical polishing.

BACKGROUND

An integrated circuit is typically formed on a substrate by the sequential deposition of conductive, semi conductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier head. The exposed surface of the substrate is typically placed against a rotating polishing pad with a durable roughened surface. The carrier head provides a controllable load on the substrate to push it against the polishing pad. A polishing liquid, such as a slurry with abrasive particles, is typically supplied to the surface of the polishing pad.

One problem in CMP is using an appropriate polishing rate to achieve a desirable profile, e.g., a substrate layer that has been planarized to a desired flatness or thickness, or a desired amount of material has been removed. Variations in the initial thickness of a substrate layer, the slurry composition, the polishing pad condition, the relative speed between the polishing pad and a substrate, and the load on a substrate can cause variations in the material removal rate across a substrate, and from substrate to substrate. These variations cause variations in the time needed to reach the polishing endpoint and the amount removed. Therefore, it may not be possible to determine the polishing endpoint merely as a function of the polishing time, or to achieve a desired profile merely by applying a constant pressure.

In some systems, a substrate is optically monitored in-situ during polishing, e.g., through a window in the polishing pad. However, existing optical monitoring techniques may not satisfy increasing demands of semiconductor device manufacturers.

SUMMARY

In one aspect, a computer-implemented method of polishing includes measuring a first pre-polish thickness of a layer of a first substrate at an in-line metrology station, measuring a second pre-polish thickness of a layer of a second substrate at the in-line metrology station, simultaneously contacting the first substrate and the second substrate to the same polishing pad, wherein pressures applied to the first substrate and the second substrate are independently controllable, determining a difference between a first expected required polish time for the first substrate and a second expected required polish time for the second substrate using the first pre-polish thickness and the second pre-polish thickness, determining a duration of an initial period based on the difference between the first expected required polish time and the second expected required polish time, for the initial period at a beginning of a polishing operation, applying no pressure to whichever of the first substrate and the second substrate has a lesser expected required polish time while simultaneously applying pressure to whichever of the first substrate and the second substrate has a greater expected required polish time, and after the initial period, applying pressure to both the first substrate and the second substrate.

Implementations may include one or more of the following features. A first target thickness for the first substrate and a second target thickness for the second substrate may be stored. The duration of the initial period may be selected such that a thickness difference between the first substrate and the second substrate is closer to a difference between the first target thickness and the second target thickness at an intermediate time before a projected endpoint time than without such an initial period. The first target thickness may be equal to the second target thickness. The first target thickness and the second target thickness may be zero. The layer of the first substrate and the layer of the second substrate may be metal. The first target thickness may be subtracted from the first pre-polish thickness to determine a first amount to remove from the first substrate and the second target thickness may be subtracted from the second pre-polish thickness to determine a second amount to remove from the second substrate. Determining the difference between the first expected required polish time and the second expected required polish time may include storing a polishing rate calculated prior to polishing of the first substrate and the second substrate. Determining the difference between the first expected required polish time and the second expected required polish time may include dividing the first amount to remove by the polishing rate to determine the first expected required polish time, and dividing the second amount to remove by the polishing rate to determine the second expected required polish time. The polishing rate may be calculated by determining the polishing rate of at least one substrate polished on the polishing pad before polishing of the first substrate and the second substrate. Determining the polishing rate may include calculating a moving average of polishing rates of a plurality of substrates polished on the polishing pad before polishing of the first substrate and the second substrate. The initial period may equal the difference between the first expected required polish time and the second expected required polish time. The first substrate and the second substrate may be monitored during polishing with an in-situ monitoring system. At a time after the initial period, the pressure of at least one of the first or second substrate may be adjusted such that the first substrate and the second substrate reach target thickness at closer to the same time than without such adjustment.

In another aspect, a computer-implemented method of polishing includes measuring a first pre-polish thickness of a layer of a first substrate at an in-line metrology station, measuring a second pre-polish thickness of a layer of a second substrate at the in-line metrology station, simultaneously contacting the first substrate and the second substrate to the same polishing pad, wherein pressures applied to the first substrate and the second substrate are independently controllable, determining a difference between a first expected required polish time for the first substrate and a second expected required polish time for the second substrate based on the first pre-polish thickness and the second pre-polish thickness, determining a pressure ratio to apply between the first substrate and the second substrate using the difference between the first expected required polish time and the second expected required polish time such that the first substrate and the second substrate have closer to the same thickness at an intermediate time before a projected endpoint time than without such a pressure difference, and at least until the intermediate time, applying pressures to the first substrate and the second substrate at the pressure ratio.

Implementations may include one or more of the following features. The pressure ratio may equal the ratio between the second expected required polish time and the first expected required polish time. A first target thickness for the first substrate and a second target thickness for the second substrate may be stored. Polishing of the first substrate and the second substrate may be commenced at a substantially same time. The first target thickness may be equal to the second target thickness. The first target thickness and the second target thickness may be zero. The layer of the first substrate and the layer of the second substrate may be metal. The first target thickness may be subtracted from the first pre-polish thickness to determine a first amount to remove from the first substrate and the second target thickness may be subtracted from the second pre-polish thickness to determine a second amount to remove from the second substrate. The difference between the first expected required polish time and the expected required second polish time may be determined based on a polishing rate calculated prior to polishing of the first substrate and the second substrate. Determining the difference between the first expected required polish time and the second expected required polish time may include dividing the first amount to remove by the polishing rate to determine the first expected required polishing time, and dividing the second amount to remove by the polishing rate to determine the second expected required polishing time. The polishing rate may be calculated by determining the polishing rate of at least one substrate polished on the polishing pad before polishing of the first substrate and the second substrate. Determining the polishing rate may include calculating a moving average of polishing rates of a plurality of substrates polished on the polishing pad before polishing of the first substrate and the second substrate. The first substrate and the second substrate may be monitored during polishing with an in-situ monitoring system. At a time after the initial period, the pressure of at least one of the first or second substrate may be adjusted such that the first substrate and the second substrate reach target thickness at closer to the same time than without such adjustment.

In other aspects, polishing systems and computer-program products tangibly embodied on a computer readable medium are provided to carry out these methods.

Certain implementations may have one or more of the following advantages. If all of the substrates on the same platen endpoint at approximately the same time, defects can be avoided, such as scratches caused by rinsing a substrate with water too early or corrosion caused by failing to rinse a substrate in a timely manner. Equalizing polishing times across multiple substrates can also improve throughput. Substrates with different incoming layer thicknesses can be polished to the same target thickness more reliably. Equalizing polishing times for different zones within a substrate can also decrease within-wafer non-uniformity (WIWNU), i.e., improve substrate layer uniformity. In addition, it may be possible to provide a substrate with a deliberately pre-selected non-uniformity, e. g., variance of a substrate from a target profile can be decreased.

The details of one or more embodiments are set forth in the accompanying drawings and the description below. Other features, aspects, and advantages will become apparent from the description, the drawings, and the claims.

BRIEF DESCRIPTION OF THE DRAWINGS

FIG. 4 illustrates a measured spectrum from the in-situ optical monitoring system.

FIG. 5 illustrates a library of reference spectra.

Like reference numbers and designations in the various drawings indicate like elements.

DETAILED DESCRIPTION

Where multiple substrates are being polished simultaneously, e.g., on the same polishing pad, polishing rate variations between the substrates can lead to the substrates reaching their target thickness at different times. On the one hand, if polishing is halted simultaneously for the substrates, then some will not be at the desired thickness. On the other hand, if polishing for the substrates is stopped at different times, then some substrates may have defects and the polishing apparatus is operating at lower throughput.

In some cases, the initial thicknesses of two substrates on a same platen can be different. In such cases, starting the polishing operation on both substrates simultaneously with substantially same polishing rates may lead to the thinner substrate reaching the polishing end point sooner than the thicker substrate. However, since it is desirable to rinse the substrates simultaneously and as soon as the polishing end points are reached, it could be of interest to adjust the polishing process such that the end points for both substrates are reached together or at least within short time from each other. By determining a time offset for starting the polishing operations of the two substrates the substrates can be made to achieve closer endpoint conditions. By "closer endpoint conditions," it is meant that the substrates would reach their target thickness closer to the same time than without the time offset, or if the substrates halt polishing at the same time, that the substrates would have closer to the same thickness than without the time offset.

Figure 1:
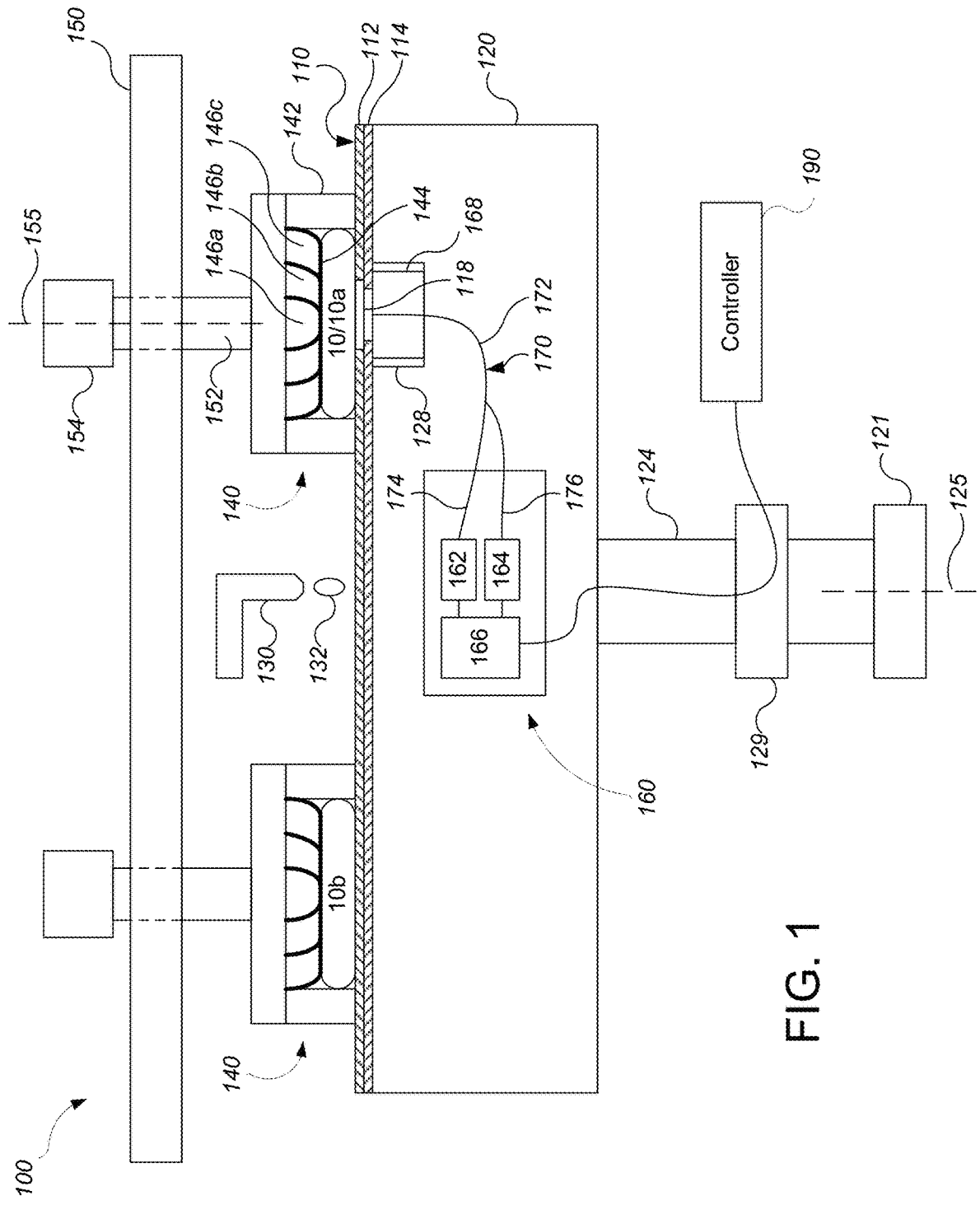
FIG. 1 illustrates a schematic cross-sectional view of an example of a polishing apparatus having two polishing heads.

FIG. 1 illustrates an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be detachably secured to the platen 120, for example, by a layer of adhesive. The polishing pad 110 can be a two-layer polishing pad with an outer polishing layer 112 and a softer backing layer 114.

The polishing apparatus 100 can include a combined slurry/rinse arm 130. During polishing, the arm 130 is operable to dispense a polishing liquid 132, such as a slurry, onto the polishing pad 110. While only one slurry/rinse arm 130 is shown, additional nozzles, such as one or more dedicated slurry arms per carrier head, can be used. The polishing apparatus can also include a polishing pad conditioner to abrade the polishing pad 110 to maintain the polishing pad 110 in a consistent abrasive state.

In this embodiment, the polishing apparatus 100 includes two (or two or more) carrier heads 140. Each carrier head 140 is operable to hold a substrate 10 (e.g., a first substrate 10a at one carrier head and a second substrate 10b at the other carrier head) against the polishing pad 110. Each carrier head 140 can have independent control of the polishing parameters, for example pressure, associated with each respective substrate.

Figure 2:
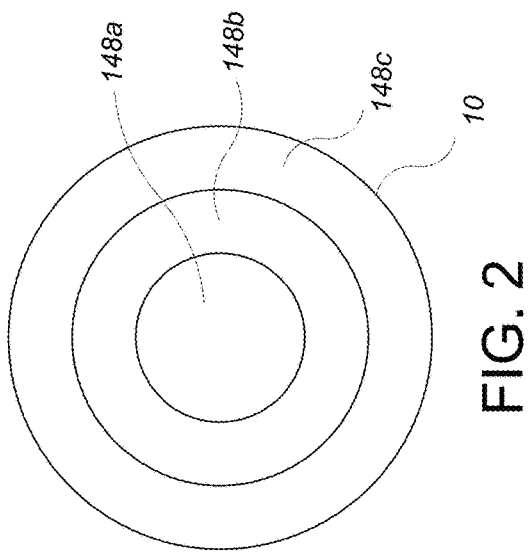
FIG. 2 illustrates a schematic top view of a substrate having multiple zones.

In particular, each carrier head 140 can include a retaining ring 142 to retain the substrate 10 below a flexible membrane 144. Each carrier head 140 also includes a plurality of independently controllable pressurizable chambers defined by the membrane, e.g., 3 chambers 146a-146c, which can apply independently controllable pressurizes to associated zones 148a-148c on the flexible membrane 144 and thus on the substrate 10 (see FIG. 2). Referring to FIG. 2, the center zone 148a can be substantially circular, and the remaining zones 148b-148e can be concentric annular zones around the center zone 148a. Although only three chambers are illustrated in FIGS. 1 and 2 for ease of illustration, there could be two chambers, or four or more chambers, e.g., five chambers.

Returning to FIG. 1, each carrier head 140 is suspended from a support structure 150, e.g., a carousel, and is connected by a drive shaft 152 to a carrier head rotation motor 154 so that the carrier head can rotate about an axis 155. Optionally each carrier head 140 can oscillate laterally, e.g., on sliders on the carousel 150; or by rotational oscillation of the carousel itself. In operation, the platen is rotated about its central axis 125, and each carrier head is rotated about its central axis 155 and translated laterally across the top surface of the polishing pad.

While only two carrier heads 140 are shown, more carrier heads can be provided to hold additional substrates so that the surface area of polishing pad 110 may be used efficiently. Thus, the number of carrier head assemblies adapted to hold substrates for a simultaneous polishing process can be based, at least in part, on the surface area of the polishing pad 110.

The polishing apparatus also includes an in-situ monitoring system 160, which can be used to determine whether to adjust a polishing rate or an adjustment for the polishing rate as discussed below. The in-situ monitoring system 160 can include an optical monitoring system, e.g., a spectrographic monitoring system, or an eddy current monitoring system.

In one embodiment, the monitoring system 160 is an optical monitoring system. An optical access through the polishing pad is provided by including an aperture (i.e., a hole that runs through the pad) or a solid window 118. The solid window 118 can be secured to the polishing pad 110, e.g., as a plug that fills an aperture in the polishing pad, e.g., is molded to or adhesively secured to the polishing pad, although in some implementations the solid window can be supported on the platen 120 and project into an aperture in the polishing pad.

The optical monitoring system 160 can include a light source 162, a light detector 164, and circuitry 166 for sending and receiving signals between a remote controller 190, e.g., a computer, and the light source 162 and light detector 164. One or more optical fibers can be used to transmit the light from the light source 162 to the optical access in the polishing pad, and to transmit light reflected from the substrate 10 to the detector 164. For example, a bifurcated optical fiber 170 can be used to transmit the light from the light source 162 to the substrate 10 and back to the detector 164. The bifurcated optical fiber an include a trunk 172 positioned in proximity to the optical access, and two branches 174 and 176 connected to the light source 162 and detector 164, respectively.

In some implementations, the top surface of the platen can include a recess 128 into which is fit an optical head 168 that holds one end of the trunk 172 of the bifurcated fiber. The optical head 168 can include a mechanism to adjust the vertical distance between the top of the trunk 172 and the solid window 118.

The output of the circuitry 166 can be a digital electronic signal that passes through a rotary coupler 129, e.g., a slip ring, in the drive shaft 124 to the controller 190 for the optical monitoring system. Similarly, the light source can be turned on or off in response to control commands in digital electronic signals that pass from the controller 190 through the rotary coupler 129 to the optical monitoring system 160. Alternatively, the circuitry 166 could communicate with the controller 190 by a wireless signal.

The light source 162 can be operable to emit white light. In one implementation, the white light emitted includes light having wavelengths of 200-800 nanometers. A suitable light source is a xenon lamp or a xenon mercury lamp.

The light detector 164 can be a spectrometer. A spectrometer is an optical instrument for measuring intensity of light over a portion of the electromagnetic spectrum. A suitable spectrometer is a grating spectrometer. Typical output for a spectrometer is the intensity of the light as a function of wavelength (or frequency).

As noted above, the light source 162 and light detector 164 can be connected to a computing device, e.g., the controller 190, operable to control their operation and receive their signals. The computing device can include a microprocessor situated near the polishing apparatus, e.g., a programmable computer. With respect to control, the computing device can, for example, synchronize activation of the light source with the rotation of the platen 120.

In some implementations, the light source 162 and detector 164 of the in-situ monitoring system 160 are installed in and rotate with the platen 120. In this case, the motion of the platen will cause the sensor to scan across each substrate. In particular, as the platen 120 rotates, the controller 190 can cause the light source 162 to emit a series of flashes starting just before and ending just after each substrate 10 passes over the optical access. Alternatively, the computing device can cause the light source 162 to emit light continuously starting just before and ending just after each substrate 10 passes over the optical access. In either case, the signal from the detector can be integrated over a sampling period to generate spectra measurements at a sampling frequency.

In operation, the controller 190 can receive, for example, a signal that carries information describing a spectrum of the light received by the light detector for a particular flash of the light source or time frame of the detector. Thus, this spectrum is a spectrum measured in-situ during polishing.

Figure 3A:
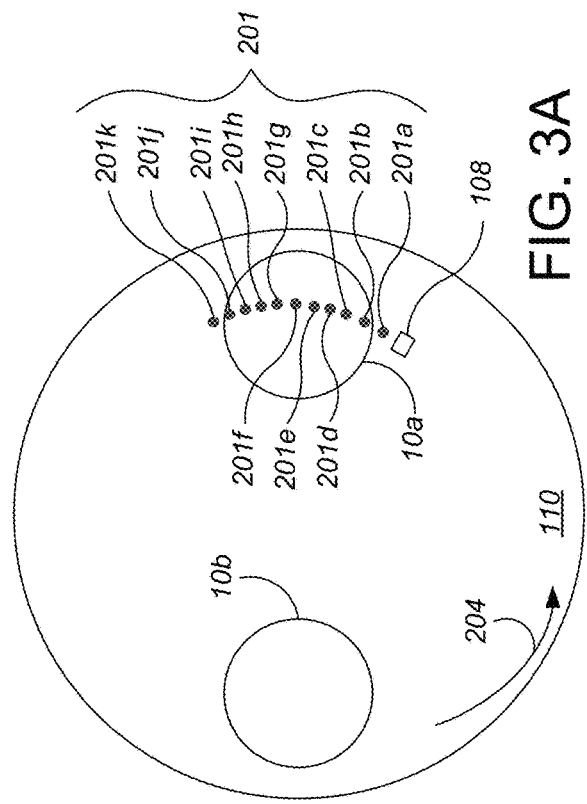
FIG. 3A illustrates a top view of a polishing pad and shows locations where in-situ measurements are taken on a first substrate.
Figure 3B:
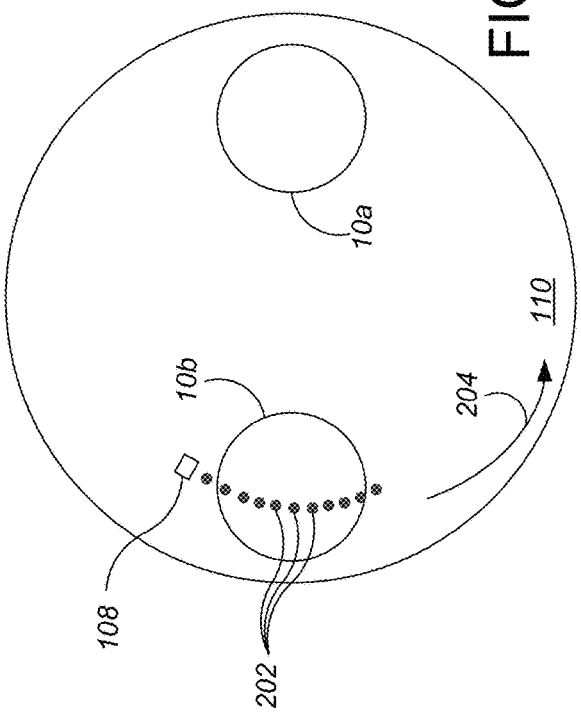
FIG. 3B illustrates a top view of a polishing pad and shows locations where in-situ measurements are taken on a second substrate.

As shown by in FIG. 3A, if the detector is installed in the platen, due to the rotation of the platen (shown by arrow 204), as the window 108 travels below one carrier head (e.g., the carrier head holding the first substrate 10a), the optical monitoring system making spectra measurements at a sampling frequency will cause the spectra measurements to be taken at locations 201 in an arc that traverses the first substrate 10a. For example, each of points 201 a-201 k represents a location of a spectrum measurement by the monitoring system of the first substrate 10a (the number of points is illustrative; more or fewer measurements can be taken than illustrated, depending on the sampling frequency). As shown, over one rotation of the platen, spectra are obtained from different radii on the substrate 10a. That is, some spectra are obtained from locations closer to the center of the substrate 10a and some are closer to the edge. Similarly, as shown by in FIG. 3B, due to the rotation of the platen, as the window travels below the other carrier head (e.g., the carrier head holding the second substrate 10b) the optical monitoring system making spectra measurements at the sampling frequency will cause the spectra measurements to be taken at locations 202 along an arc that traverses the second substrate 10b.

Thus, for any given rotation of the platen, based on timing and motor encoder information, the controller can determine which substrate, e.g., substrate 10a or 10b, is the source of the measured spectrum. In addition, for any given scan of the optical monitoring system across a substrate, e.g., substrate 10a or 10b, based on timing, motor encoder information, and optical detection of the edge of the substrate and/or retaining ring, the controller 190 can calculate the radial position (relative to the center of the particular substrate 10a or 10b being scanned) for each measured spectrum from the scan. The polishing system can also include a rotary position sensor, e.g., a flange attached to an edge of the platen that will pass through a stationary optical interrupter, to provide additional data for determination of which substrate and the position on the substrate of the measured spectrum. The controller can thus associate the various measured spectra with the controllable zones 148b-148e (see FIG. 2) on the substrates 10a and 10b. In some implementations, the time of measurement of the spectrum can be used as a substitute for the exact calculation of the radial position.

Over multiple rotations of the platen, for each zone of each substrate, a sequence of spectra can be obtained over time. Without being limited to any particular theory, the spectrum of light reflected from the substrate 10 evolves as polishing progresses (e.g., over multiple rotations of the platen, not during a single sweep across the substrate) due to changes in the thickness of the outermost layer, thus yielding a sequence of time-varying spectra. Moreover, particular spectra are exhibited by particular thicknesses of the layer stack.

In some implementations, the controller, e.g., the computing device, can be programmed to compare a measured spectrum to multiple reference spectra to and determine which reference spectrum provides the best match. In particular, the controller can be programmed to compare each spectrum from a sequence of measured spectra from each zone of each substrate to multiple reference spectra to generate a sequence of best matching reference spectra for each zone of each substrate.

As used herein, a reference spectrum is a predefined spectrum generated prior to polishing of the substrate. A reference spectrum can have a pre-defined association, i.e., defined prior to the polishing operation, with a value representing a time in the polishing process at which the spectrum is expected to appear, assuming that the actual polishing rate follows an expected polishing rate. Alternatively or in addition, the reference spectrum can have a pre-defined association with a value of a substrate property, such as a thickness of the outermost layer.

A reference spectrum can be generated empirically, e.g., by measuring the spectra from a test substrate, e.g., a test substrate having a known initial layer thicknesses. For example, to generate a plurality of reference spectra, a set-up substrate is polished using the same polishing parameters that would be used during polishing of device wafers while a sequence of spectra are collected. For each spectrum, a value is recorded representing the time in the polishing process at which the spectrum was collected. For example, the value can be an elapsed time, or a number of platen rotations. The substrate can be overpolished, i.e., polished past a desired thickness, so that the spectrum of the light that reflected from the substrate when the target thickness is achieved can be obtained.

In order to associate each spectrum with a value of a substrate property, e.g., a thickness of the outermost layer, the initial spectra and property of a "set-up" substrate with the same pattern as the product substrate can be measured pre-polish at a metrology station. The final spectrum and property can also be measured post-polish with the same metrology station or a different metrology station. The properties for spectra between the initial spectra and final spectra can be determined by interpolation, e.g., linear interpolation based on elapsed time at which the spectra of the test substrate was measured.

In addition to being determined empirically, some or all of the reference spectra can be calculated from theory, e.g., using an optical model of the substrate layers. For example, and optical model can be used to calculate a reference spectrum for a given outer layer thickness D. A value representing the time in the polishing process at which the reference spectrum would be collected can be calculated, e.g., by assuming that the outer layer is removed at a uniform polishing rate. For example, the time Ts for a particular reference spectrum can be calculated simply by assuming a starting thickness D0 and uniform polishing rate R (Ts= (D0−D)/R). As another example, linear interpolation between measurement times T1, T2 for the pre-polish and post-polish thicknesses D1, D2 (or other thicknesses measured at the metrology station) based on the thickness D used for the optical model can be performed (Ts=T2−T1*(DI−D)/(DI−D2)).

Referring to FIGS. 4 and 5, a measured spectrum 300 (see FIG. 4) can be compared to reference spectra 320 from one or more libraries 310 (see FIG. 5). As used herein, a library of reference spectra is a collection of reference spectra which represent substrates that share a property in common. However, the property shared in common in a single library may vary across multiple libraries of reference spectra. For example, two different libraries can include reference spectra that represent substrates with two different underlying thicknesses. For a given library of reference spectra, variations in the upper layer thickness, rather than other factors (such as differences in wafer pattern, underlying layer thickness, or layer composition), can be primarily responsible for the differences in the spectral intensities.

Reference spectra 320 for different libraries 310 can be generated by polishing multiple "set-up" substrates with different substrate properties (e.g., underlying layer thicknesses, or layer composition) and collecting spectra as discussed above; the spectra from one set-up substrate can provide a first library and the spectra from another substrate with a different underlying layer thickness can provide a second library. Alternatively or in addition, reference spectra for different libraries can be calculated from theory, e.g., spectra for a first library can be calculated using the optical model with the underlying layer having a first thickness, and spectra for a second library can be calculated using the optical model with the underlying layer having a different thickness.

In some implementations, each reference spectrum 320 is assigned an index value 330. In general, each library 310 can include many reference spectra 320, e.g., one or more, e.g., exactly one, reference spectra for each platen rotation over the expected polishing time of the substrate. This index 330 can be the value, e.g., a number, representing the time in the polishing process at which the reference spectrum 320 is expected to be observed. The spectra can be indexed so that each spectrum in a particular library has a unique index value. The indexing can be implemented so that the index values are sequenced in an order in which the spectra were measured. An index value can be selected to change monotonically, e.g., increase or decrease, as polishing progresses. In particular, the index values of the reference spectra can be selected so that they form a linear function of time or number of platen rotations (assuming that the polishing rate follows that of the model or test substrate used to generate the reference spectra in the library). For example, the index value can be proportional, e.g., equal, to a number of platen rotations at which the reference spectra was measured for the test substrate or would appear in the optical model. Thus, each index value can be a whole number. The index number can represent the expected platen rotation at which the associated spectrum would appear.

The reference spectra and their associated index values can be stored in a reference library. For example, each reference spectrum 320 and its associated index value 330 can be stored in a record 340 of database 350. The database 350 of reference libraries of reference spectra can be implemented in memory of the computing device of the polishing apparatus.

As noted above, for each zone of each substrate, based on the sequence of measured spectra or that zone and substrate, the controller 190 can be programmed to generate a sequence of best matching spectra. A best matching reference spectrum can be determined by comparing a measured spectrum to the reference spectra from a particular library.

In some implementations, the best matching reference spectrum can be determined by calculating, for each reference spectra, a sum of squared differences between the measured spectrum and the reference spectrum. The reference spectrum with the lowest sum of squared differences has the best fit. Other techniques for finding a best matching reference spectrum are possible, e. g., performing a cross-correlation between the measured spectrum and each reference spectrum, and selecting the reference spectrum with the greatest correlation as the best matching reference spectrum.

A method that can be applied to decrease computer processing is to limit the portion of the library that is searched for matching spectra. The library typically includes a wider range of spectra than will be obtained while polishing a substrate. During substrate polishing, the library searching is limited to a predetermined range of library spectra. In some embodiments, the current rotational index N of a substrate being polished is determined. For example, in an initial platen rotation, N can be determined by searching all of the reference spectra of the library. For the spectra obtained during a subsequent rotation, the library is searched within a range of freedom of N. That is, if during one rotation the index number is found to be N, during a subsequent rotation which is X rotations later, where the freedom is Y, the range that will be searched from (N+X)−Y to (N+X)+Y.

Figure 6:
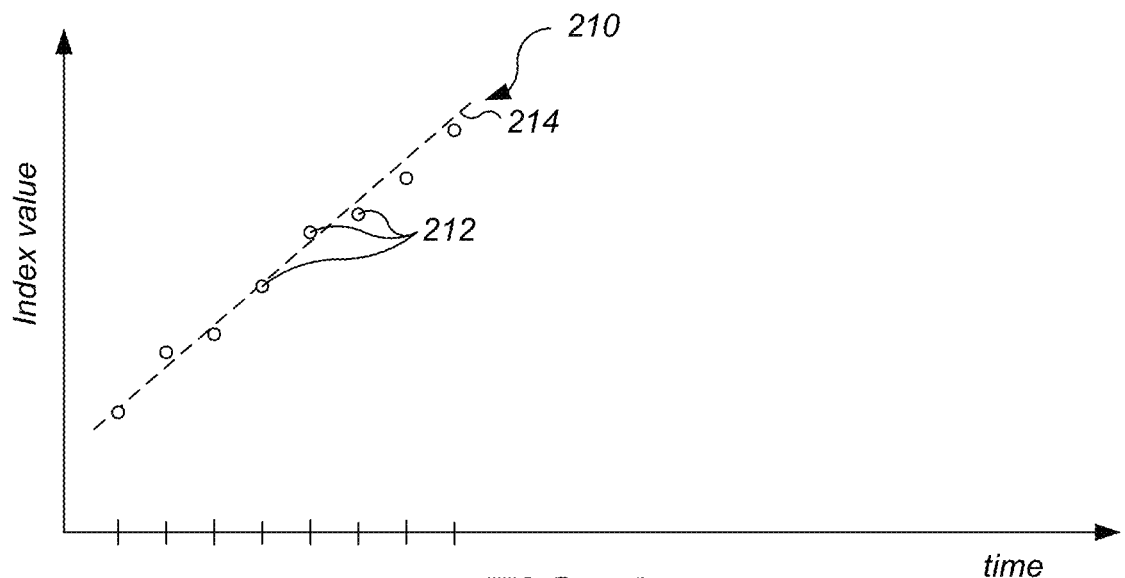
FIG. 6 illustrates an index trace.

Referring to FIG. 6, which illustrates the results for only a single zone of a single substrate, the index value of each of the best matching spectra in the sequence can be determined to generate a time-varying sequence of index values 212. This sequence of index values can be termed an index trace 210. In some implementations, an index trace is generated by comparing each measured spectrum to the reference spectra from exactly one library. In general, the index trace 210 can include one, e.g., exactly one, index value per sweep of the optical monitoring system below the substrate.

For a given index trace 210, where there are multiple spectra measured for a particular substrate and zone in a single sweep of the optical monitoring system (termed "current spectra"), a best match can be determined between each of the current spectra and the reference spectra of one or more, e.g., exactly one, library. In some implementations, each selected current spectra is compared against each reference spectra of the selected library or libraries. Given current spectra e, f, and g, and reference spectra E, F, and G, for example, a matching coefficient could be calculated for each of the following combinations of current and reference spectra: e and E, e and F, e and G, f and E, f and F, f and G, g and E, g and F, and g and G. Whichever matching coefficient indicates the best match, e. g., is the smallest, determines the best-matching reference spectrum, and thus the index value. Alternatively, in some implementations, the current spectra can be combined, e.g., averaged, and the resulting combined spectrum is compared against the reference spectra to determine the best match, and thus the index value.

In some implementations, for at least some zones of some substrates, a plurality of index traces can be generated. For a given zone of a given substrate, an index trace can be generated for each reference library of interest. That is, for each reference library of interest to the given zone of the given substrate, each measured spectrum in a sequence of measured spectra is compared to reference spectra from a given library, a sequence of the best matching reference spectra is determined, and the index values of the sequence of best matching reference spectra provide the index trace for the given library.

In summary, each index trace includes a sequence 210 of index values 212, with each particular index value 212 of the sequence being generated by selecting the index of the reference spectrum from a given library that is the closest fit to the measured spectrum. The time value for each index of the index trace 210 can be the same as the time at which the measured spectrum was measured.

Figure 7:
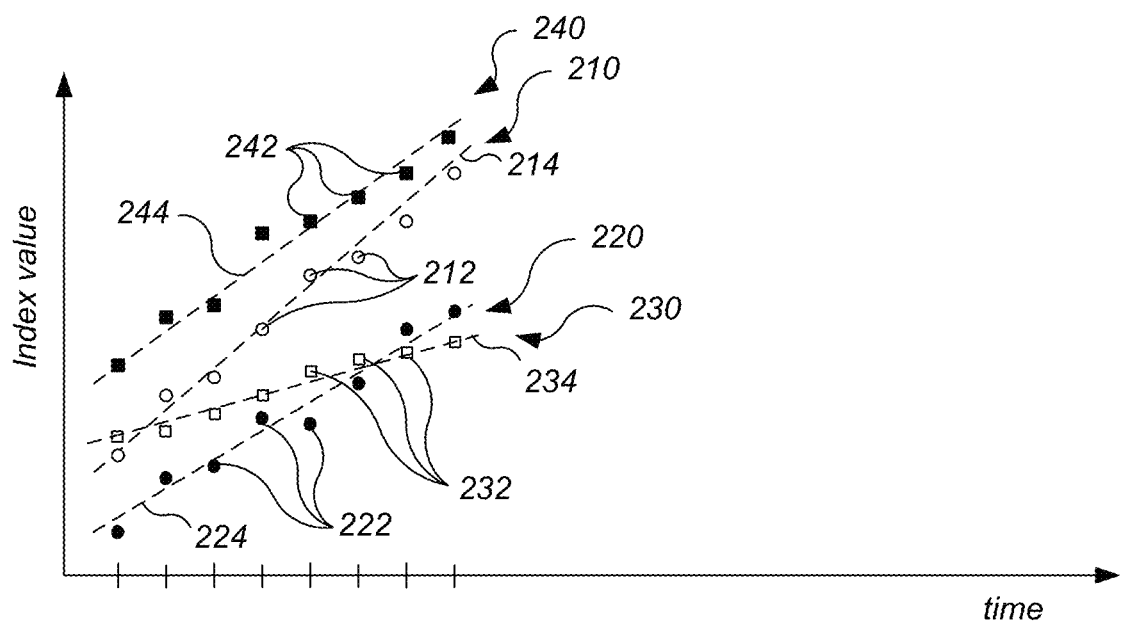
FIG. 7 illustrates a plurality of index traces for different zones of different substrates.

Referring to FIG. 7, a plurality of index traces is illustrated. As discussed above, an index trace can be generated for each zone of each substrate. For example, a first sequence 210 of index values 212 (shown by hollow circles) can be generated for a first zone of a first substrate, a second sequence 220 of index values 222 (shown by solid circles) can be generated for a second zone of the first substrate, a third sequence 230 of index values 232 (shown by hollow squares) can be generated for a first zone of a second substrate, and a fourth sequence 240 of index values 242 (shown by solid squares) can be generated for a second zone of the second substrate.

As shown in FIG. 7, for each substrate index trace, a polynomial function of known order, e.g., a first-order function (e. g., a line) is fit to the sequence of index values for the associated zone and wafer, e.g., using robust line fitting. For example, a first line 214 can be fit to index values 212 for the first zone of the first substrate, a second line 224 can be fit to the index values 222 of the second zone of the first substrate, a third line 234 can be fit to the index values 232 of the first zone of the second substrate, and a fourth line 244 can be fit to the index values 242 of the second zone of the second substrate. Fitting of a line to the index values can include calculation of the slope S of the line and an x-axis intersection time T at which the line crosses a starting index value, e. g., O. The function can be expressed in the form $I(t)=S\cdot(t-T)$, where t is time. The x-axis intersection time T can have a negative value, indicating that the starting thickness of the substrate layer is less than expected. Thus, the first line 214 can have a first slope S1 and a first x-axis intersection time T1, the second line 224 can have a second slope S2 and a second x-axis intersection time T2, the third line 234 can have a third slope S3 and a third x-axis intersection time T3, and the fourth line 244 can have a fourth slope S4 and a fourth x-axis intersection time T4.

At some during the polishing process, e.g., at a time T0, a polishing parameter for at least one zone of at least one substrate, e.g., at least one zone of every substrate, is adjusted to adjust the polishing rate of the zone of the substrate such that at a polishing endpoint time, the plurality of zones of the plurality of substrates are closer to their target thickness than without such adjustment. In some embodiments, each zone of the plurality of substrates can have approximately the same thickness at the endpoint time.

Figure 8:
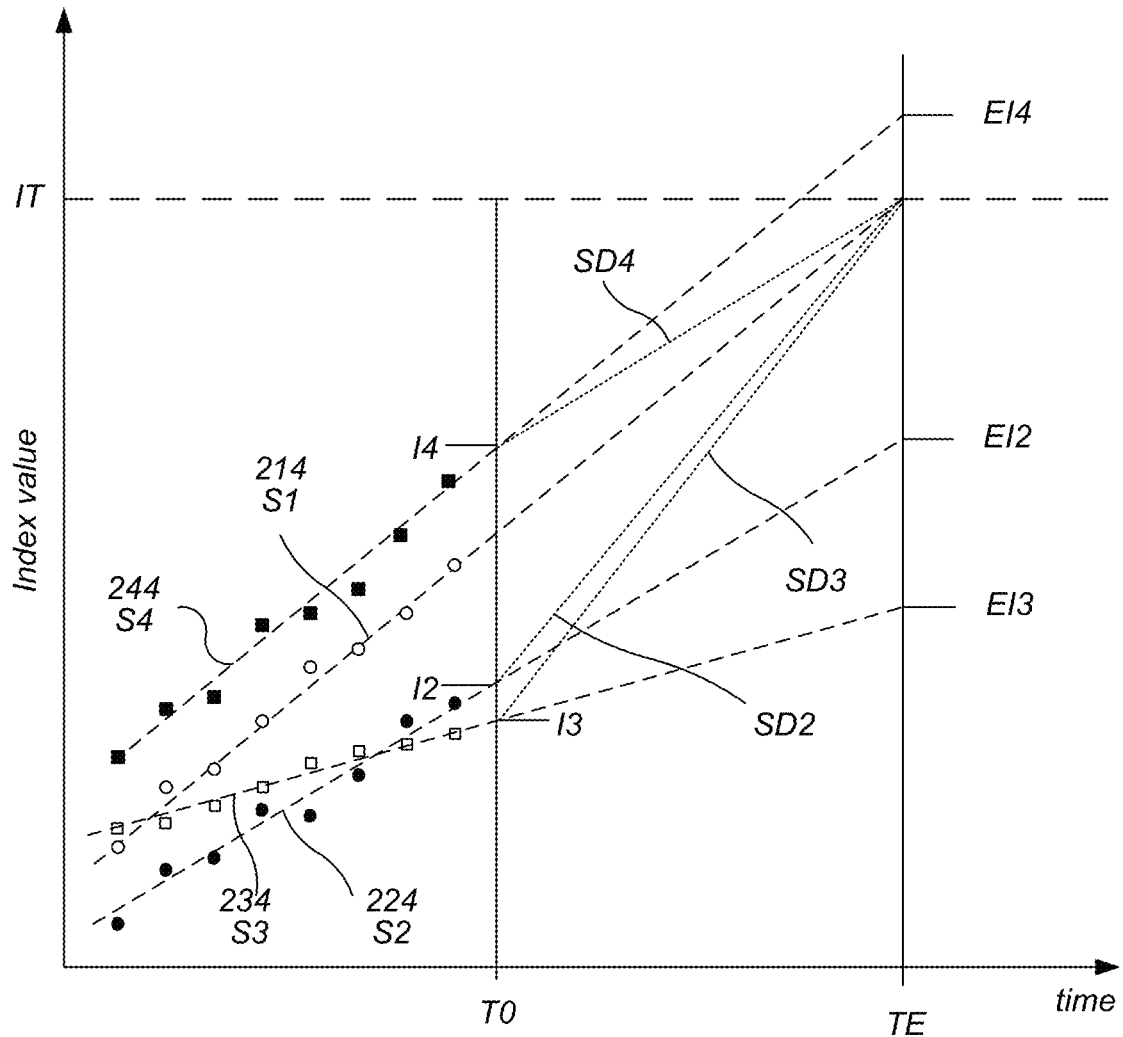
FIG. 8 illustrates a calculation of a plurality of desired slopes for a plurality of adjustable zones based on a time that an index trace of a reference zone reaches a target index.

Referring to FIG. 8, in some implementations, one zone of one substrate is selected as a reference zone, and a projected endpoint time TE at which the reference zone will reach a target index IT is determined. For example, as shown in FIG. 8, the first zone of the first substrate is selected as the reference zone, although a different zone and/or a different substrate could be selected. The target thickness IT is set by the user prior to the polishing operation and stored.

In order to determine the projected time at which the reference zone will reach the target index, the intersection of the line of the reference zone, e.g., line 214, with the target index, IT, can be calculated. Assuming that the polishing rate does not deviate from the expected polishing rate through the remainder polishing process, then the sequence of index values should retain a substantially linear progression. Thus, the expected endpoint time TE can be calculated as a simple linear interpolation of the line to the target index IT, e.g., $IT=S\cdot(TE-T)$. Thus, in the example of FIG. 8 in which the first zone of the second substrate is selected as the reference zone, with associated third line 234, $IT=S1\cdot(TE-T1)$, i.e., $TE=IT/S1-T1$.

One or more zones, e.g., all zones, other than the reference zone (including zones on other substrates) can be defined as adjustable zones. Where the lines for the adjustable zones meet the expected endpoint time TE define projected endpoint for the adjustable zones. The linear function of each adjustable zone, e.g., lines 224, 234 and 244 in FIG. 8, can thus be used to extrapolate the index, e.g., EI2, EI3 and EI4, that will be achieved at the expected endpoint time ET for the associated zone. For example, the second line 224 can be used to extrapolate the expected index, EI2, at the expected endpoint time ET for the second zone of the first substrate, the third line 234 can be used to extrapolate the expected index, EI3, at the expected endpoint time ET for the first zone of the second substrate, and the fourth line can be used to extrapolate the expected index, EI4, at the expected endpoint time ET for the second zone of the second substrate.

As shown in FIG. 8, if no adjustments are made to the polishing rate of any of the zones of any the substrates after time T0, then if endpoint is forced at the same time for all substrates, then each substrate can have a different thickness, or each substrate could have a different endpoint time (which is not desirable because it can lead to defects and loss of throughput). Here, for example, the second zone of the first substrate (shown by line 224) would endpoint at an expected index EI2 lower (and thus a thickness less) than the expected index of the first zone of the first substrate. Likewise, the first zone of the second substrate (shown by line 234) would endpoint at an expected index EI3 less (and thus a thickness less) than the first zone of the first substrate. The second zone of the second substrate (shown by line 244) would endpoint a t an expected index EI4 greater (and thus a thickness greater) than the first zone of the first substrate.

If, as shown in FIG. 8, the target index will be reached at different times for different substrates (or equivalently, the adjustable zones will have different expected indexes at the projected endpoint time of reference zone), the polishing rate can be adjusted upwardly or downwardly, such that the substrates would reach the target index (and thus target thickness) closer to the same time than without such adjustment, e.g., at approximately the same time, or would have closer to the same index value (and thus same thickness), at the target time than without such adjustment, e.g., approximately the same index value (and thus approximately the same thickness).

Thus, in the example of FIG. 8, commencing at a time T0, at least one polishing parameter for the second zone of the first substrate is modified so that the polishing rate of the zone is decreased (and as a result the slope of the index trace 220 is decreased). Also, in this example, at least one polishing parameter for the second zone of the second substrate is modified so that the polishing rate of the zone is decreased (and as a result the slope of the index trace 240 is decreased). Similarly, in this example, at least one polishing parameter for the first zone of the second substrate is modified so that the polishing rate of the zone is increased (and as a result the slope of the index trace 240 is increased). As a result both zones of both substrates would reach the target index (and thus the target thickness) at approximately the same time (or if polishing of both substrates halts at the same time, both zones of both substrates will end with approximately the same thickness).

In some implementations, if the projected index at the expected endpoint time ET indicate that a zone of the substrate is within a predefined range of the target thickness, then no adjustment may be required for that zone. The range may be 2%, e.g., within 1%, of the target index.

The polishing rates for the adjustable zones can be adjusted so that all of the zones are closer to the target index at the expected endpoint time than without such adjustment. For example, a reference zone of the reference substrate might be chosen and the processing parameters for all of the other zone adjusted such that all of the zones will endpoint at approximately the projected time of the reference substrate. The reference zone can be, for example, a predetermined zone, e.g., the center zone 148a or the zone 148b immediately surrounding the center zone, the zone having the earliest or latest projected endpoint time of any of the zones of any of the substrates, or the zone of a substrate having the desired projected endpoint. The earliest time is equivalent to the thinnest substrate if polishing is halted at the same time. Likewise, the latest time is equivalent to the thickest substrate if polishing is halted at the same time. The reference substrate can be, for example, a predetermined substrate, a substrate having the zone with the earliest or latest projected endpoint time of the substrates. The earliest time is equivalent to the thinnest zone if polishing is halted at the same time. Likewise, the latest time is equivalent to the thickest zone if polishing is halted at the same time.

For each of the adjustable zones, a desired slope for the index trace can be calculated such that the adjustable zone reaches the target index at the same time as the reference zone. For example, the desired slope SD can be calculated from (IT−I)=SD*(TE−T0), where I is the index value (calculated from the linear function fit to the sequence of index values) at time T0 polishing parameter is to be changed, IT is the target index, and TE is the calculated expected endpoint time. In the example of FIG. 8, for the second zone of the first substrate, the desired slope SD2 can be calculated from (IT−I2)=SD2*(TE−T0), for the first zone of the second substrate, the desired slope SD3 can be calculated from (IT−I3)=SD3*(TE−T0), and for the second zone of the second substrate, the desired slope SD4 can be calculated from (IT−I4)=SD4*(TE−T0).

Figure 9:
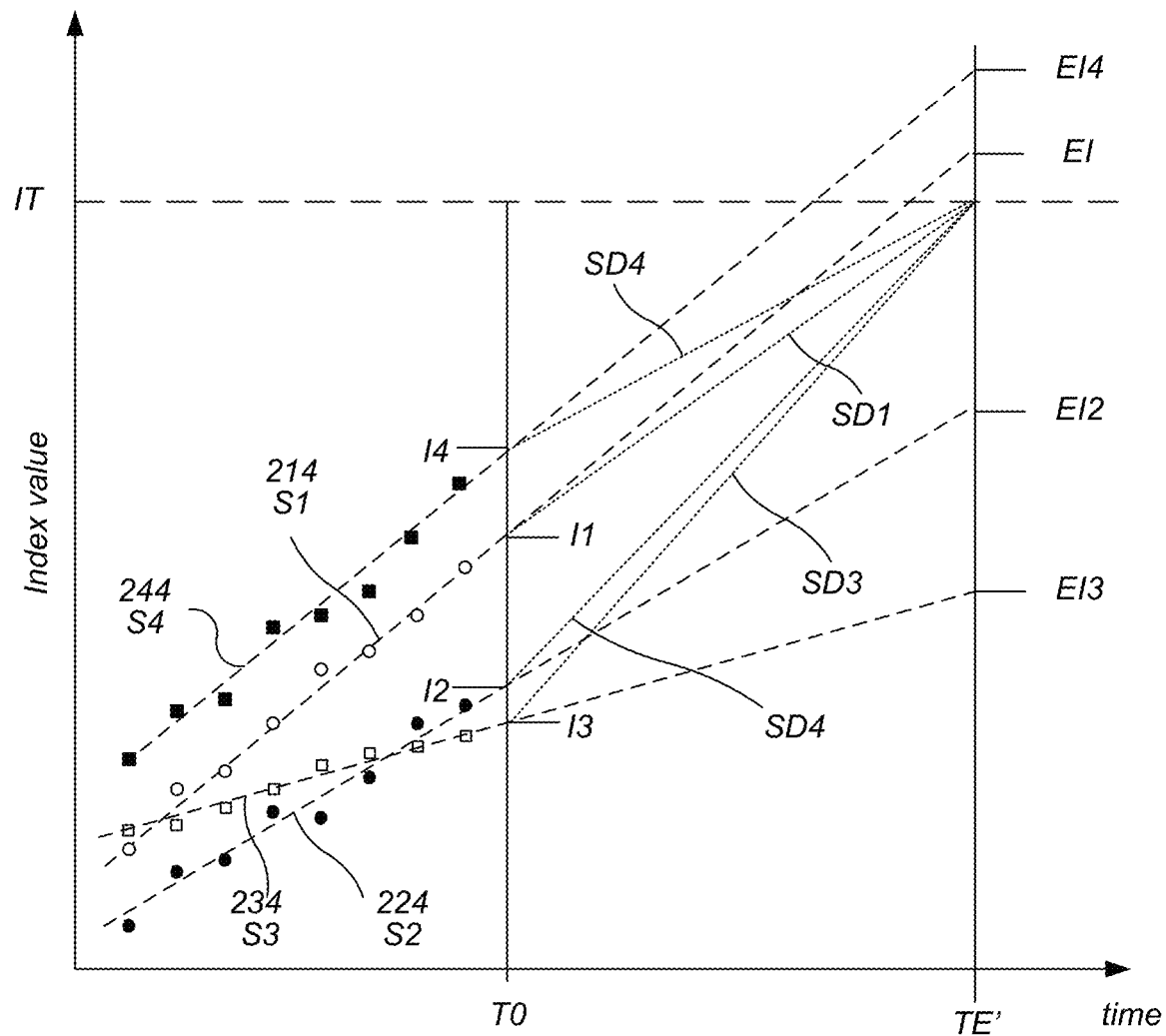
FIG. 9 illustrates a calculation of a plurality of desired slopes for a plurality of adjustable zones based on a time that an index trace of a reference zone reaches a target index.

Referring to FIG. 9, in some implementations, there is no reference zone. For example, the expected endpoint time TE' can be a predetermined time, e.g., set by the user prior to the polishing process, or can be calculated from an average or other combination of the expected endpoint times of two or more zones (as calculated by projecting the lines for various zones to the target index) from one or more substrates. In this implementation, the desired slopes are calculated substantially as discussed above (using the expected endpoint time TE' rather than TE), although the desired slope for the first zone of the first substrate must also be calculated, e.g., the desired slope SDI can be calculated from (IT−I1)=SD1*(TE'−T0).

Figure 10:
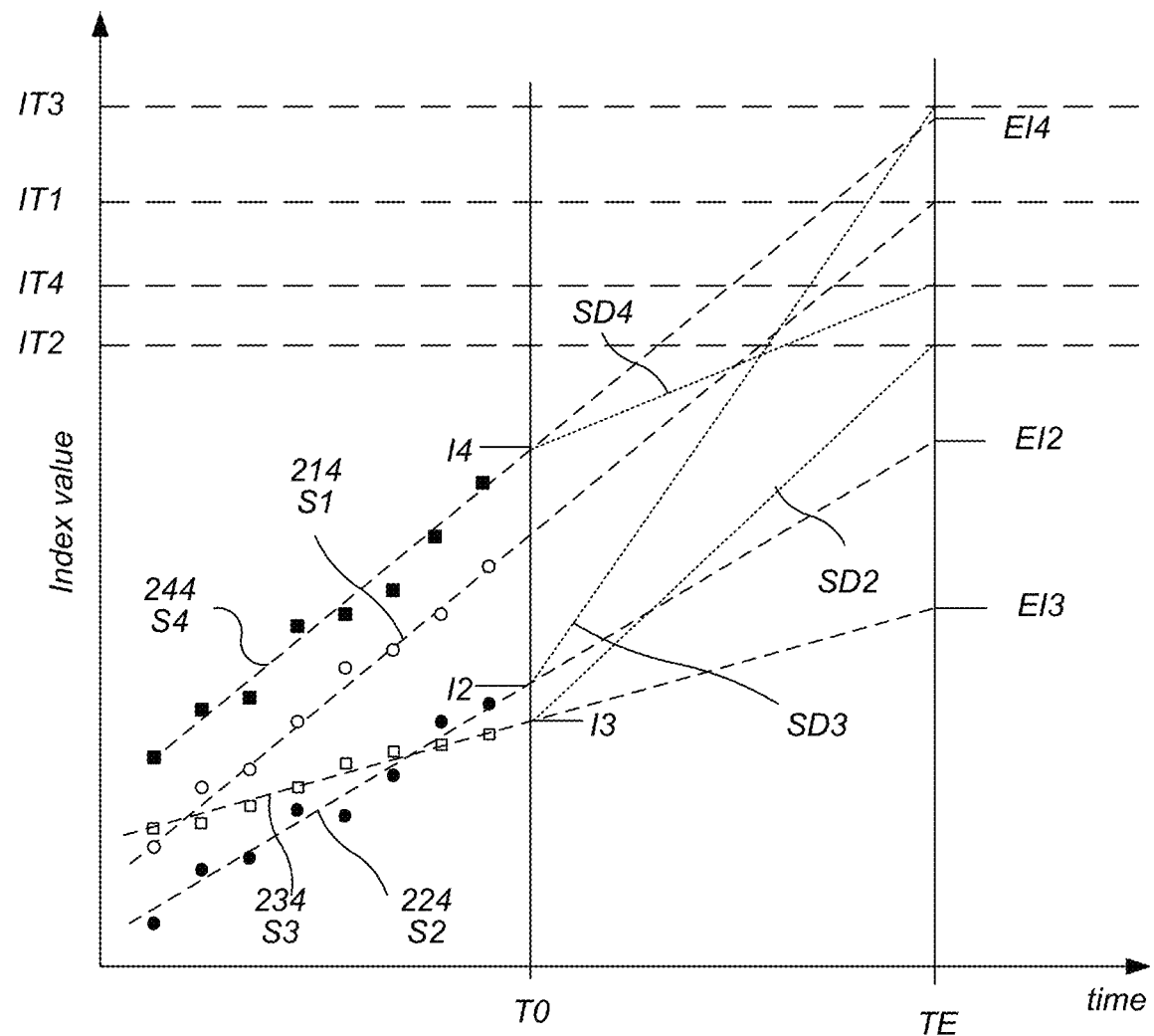
FIG. 10 illustrates a plurality of index traces for different zones of different substrates, with different zones having different target indexes.

Referring to FIG. 10, in some implementations, (which can also be combined with the implementation shown in FIG. 9), there are different target indexes for different zones. This permits the creation of a deliberate but controllable non-uniform thickness profile on the substrate. The target indexes can be entered by user, e.g., using an input device on the controller. For example, the first zone of the first substrate can have a first target indexes IT1, the second zone of the first substrate can have a second target indexes IT2, the first zone of the second substrate can have a third target indexes IT3, and the second zone of the second substrate can have a fourth target indexes IT4.

The desired slope SD for each adjustable zone can be calculated from (IT−I)=SD*(TE−T0), where I is the index value of the zone (calculated from the linear function fit to the sequence of index values for the zone) at time T0 at which the polishing parameter is to be changed, IT is the target index of the particular zone, and TE is the calculated expected endpoint time (either from a reference zone as discussed above in relation to FIG. 8, or from a preset endpoint time or from a combination of expected endpoint times as discussed above in relation to FIG. 9). In the example of FIG. 10, for the second zone of the first substrate, the desired slope SD2 can be calculated from (IT2−I2)=SD2*(TE−T0), for the first zone of the second substrate, the desired slope SD3 can be calculated from (IT3−I3)=SD3*(TE−T0), and for the second zone of the second substrate, the desired slope SD4 can be calculated from (IT4−I4)=SD4*(TE−T0).

For any of the above methods described above for FIGS. 8-10, the polishing rate is adjusted to bring the slope of index trace closer to the desired slope. The polishing rates can be adjusted by, for example, increasing or decreasing the pressure in a corresponding chamber of a carrier head. The change in polishing rate can be assumed to be directly proportional to the change in pressure, e.g., a simple Prestonian model. For example, for each zone of each substrate, where zone was polished with a pressure $P_{old}$ prior to the time T0, a new pressure $P_{new}$ to apply after time T0 can be calculated as $P_{new}=P_{old}*(SD/S)$, where S is the slope of the line prior to time T0 and SD is the desired slope.

For example, assuming that pressure $P_{old1}$ was applied to the first zone of the first substrate, pressure $P_{old2}$ was applied to the second zone of the first substrate, pressure $P_{old3}$ was applied to the first zone of the second substrate, and pressure $P_{old4}$ was applied to the second zone of the second substrate, then new pressure $P_{new1}$ for the first zone of the first substrate can be calculated as $P_{new1}=P_{old1}*(SD1/S1)$, the new pressure Pnew2 for the second zone of the first substrate clan be calculated as $P_{new2}=P_{old2}*(SD2/S2)$, the new pressure Pnew3 for the first zone of the second substrate clan be calculated as $P_{new3}=P_{old3}*(SD3/S3)$, and the new pressure Pnew4 for the second zone of the second substrate clan be calculated as $P_{new4}=P_{old4}*(SD4/S4)$.

The process of determining projected times that the substrates will reach the target thickness, and adjusting the polishing rates, can be performed just once during the polishing process, e.g., at a specified time, e.g., 40 to 60% through the expected polishing time, or performed multiple times during the polishing process, e.g., every thirty to sixty seconds. At a subsequent time during the polishing process, the rates can again be adjusted, if appropriate. During the polishing process, changes in the polishing rates can be made only a few times, such as four, three, two or only one time. The adjustment can be made near the beginning, at the middle or toward the end of the polishing process.

Polishing continues after the polishing rates have been adjusted, e.g., after time T0, the optical monitoring system continues to collect spectra for at least the reference zone and determine index values for the reference zone. In some implementations, the optical monitoring system continues to collect spectra and determine index values for each zone of each substrate. Once the index trace of a reference zone reaches the target index, endpoint is called and the polishing operation stops for both substrates.

Figure 11:
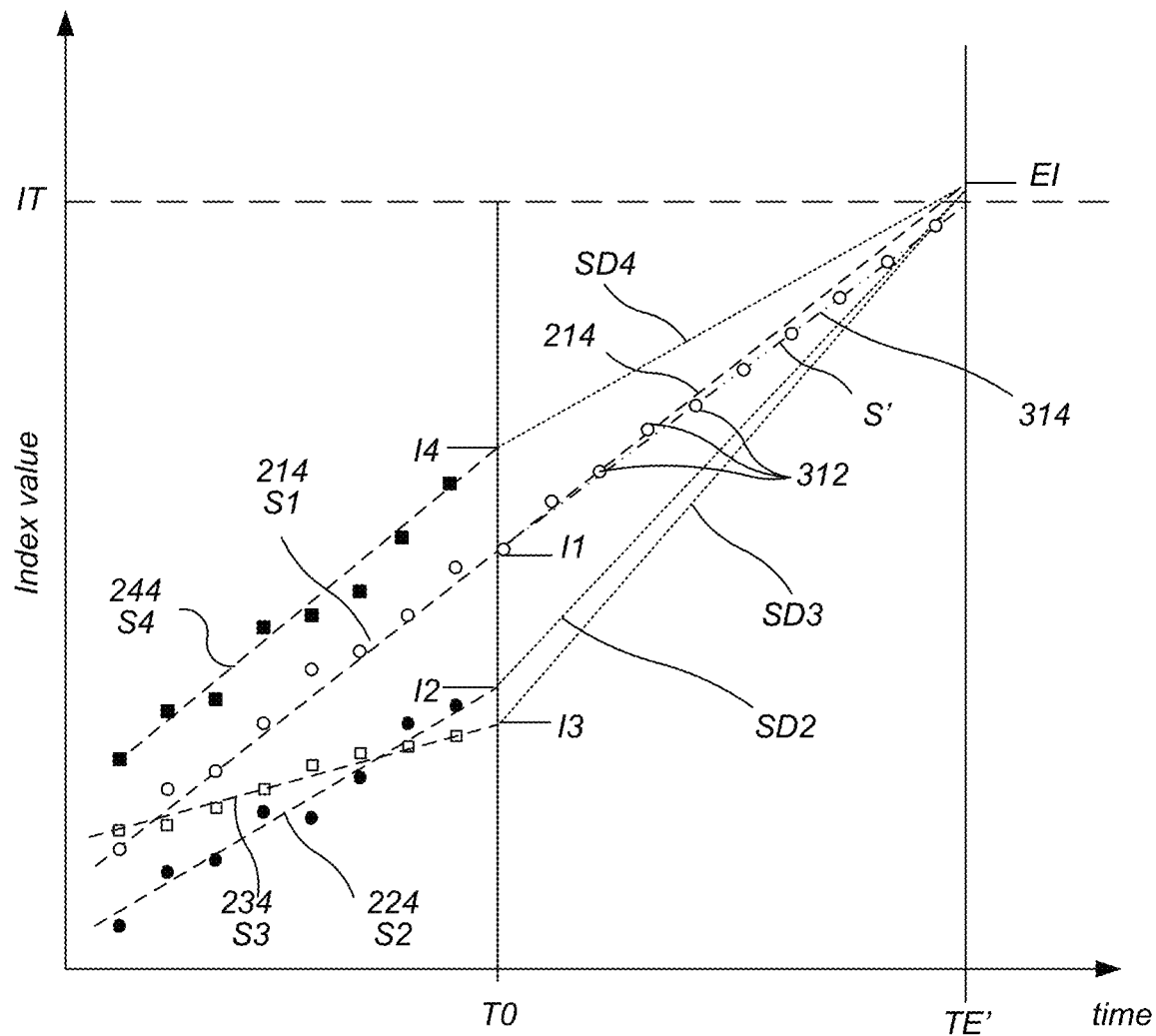
FIG. 11 illustrates a calculation of an endpoint for different zones based on a time that an index trace of a reference zone reaches a target index.

For example, as shown in FIG. 11, after time T0, the optical monitoring system continues to collect spectra for the reference zone and determine index values 312 for the reference zone. If the pressure on the reference zone did not change (e. g., as in the implementation of FIG. 8), then the linear function can be calculated using data points from both before T0 and after T0 to provide an updated linear function 314, and the time at which the linear function 314 reaches the target index IT indicates the polishing endpoint time. On the other hand, if the pressure on the reference zone changed at time T0 (e.g., as in the implementation of FIG. 9), then a new linear function 314 with a slope S' can be calculated from the sequence of index values 312 after time T0, and the time at which the new linear function 314 reaches the target index IT indicates the polishing endpoint time. The reference zone used for determining endpoint can be the same reference zone used as described above to calculate the expected endpoint time, or a different zone (or if all of the zones were adjusted as described with reference to FIG. 8, then a reference zone can be selected for the purpose of endpoint determination). If the new linear function 314 reaches the target index IT slightly later (as shown in FIG. 11) or earlier than the projected time calculated from the original linear function 214, then one or more of the zones may be slightly overpolished or underpolished, respectively. However, since the difference between the expected endpoint time and the actual polishing time should be less a couple seconds, this need not severely impact the polishing uniformity.

In some implementations, e.g., for copper polishing, after detection of the endpoint for a substrate, the substrate is immediately Subjected to an overpolishing process, e.g., to remove copper residue. The overpolishing process can be at a uniform pressure for all zones of the substrate, e.g., 1 to 1.5 psi. The overpolishing process can have a preset duration, e.g., 10 to 15 seconds.

In some implementations, polishing of the substrates does not halt simultaneously. In such implementations, for the purpose of the endpoint determination, there can be a reference zone for each substrate. Once the index trace of a reference zone of a particular substrate reaches the target index (e.g., as calculated by the time the linear function fit the sequence of index values after time T0 reaches the target index), endpoint is called for the particular substrate and application of pressure to all zones of the particular is halted simultaneously. However, polishing of one or more other substrates can continue. Only after endpoint has been called for the all of the remaining substrates (or after overpolishing has been completed for all substrates), based on the reference zones of the remaining substrates, does rinsing of the polishing pad commence. In addition, all of the carrier heads can lift the substrates off the polishing pad simultaneously.

Where multiple index traces are generated for a particular zone and substrate, e.g., one index trace for each library of interest to the particular zone and substrate, then one of the index traces can be selected for use in the endpoint or pressure control algorithm for the particular zone and substrate. For example, the each index trace generated for the same zone and substrate, the controller 190 can fit a linear function to the index values of that index trace, and determine a goodness of fit of that linear function to the sequence of index values. The index trace generated having the line with the best goodness of fit its own index values can be selected as the index trace for the particular zone and substrate. For example, when determining how to adjust the polishing rates of the adjustable zones, e.g., at time T0, the linear function with the best goodness of fit can be used in the calculation. As another example, endpoint can be called when the calculated index (as calculated from the linear function fit to the sequence of index values) for the line with the best goodness of fit matches or exceeds the target index. Also, rather than calculating an index value from the linear function, the index values themselves could be compared to the target index to determine the endpoint.

Determining whether an index trace associated with a spectra library has the best goodness of fit to the linear function associated with the library can include determining whether the index trace of the associated spectra library has the least amount of difference from the associated robust line, relatively, as compared to the differences from the associated robust line and index trace associated with another library, e.g., the lowest standard deviation, the greatest correlation, or other measure of variance. In one implementation, the goodness of fit is determined by calculating a sum of squared differences between the index data points and the linear function; the library with the lowest sum of squared differences has the best fit.

Figure 12:
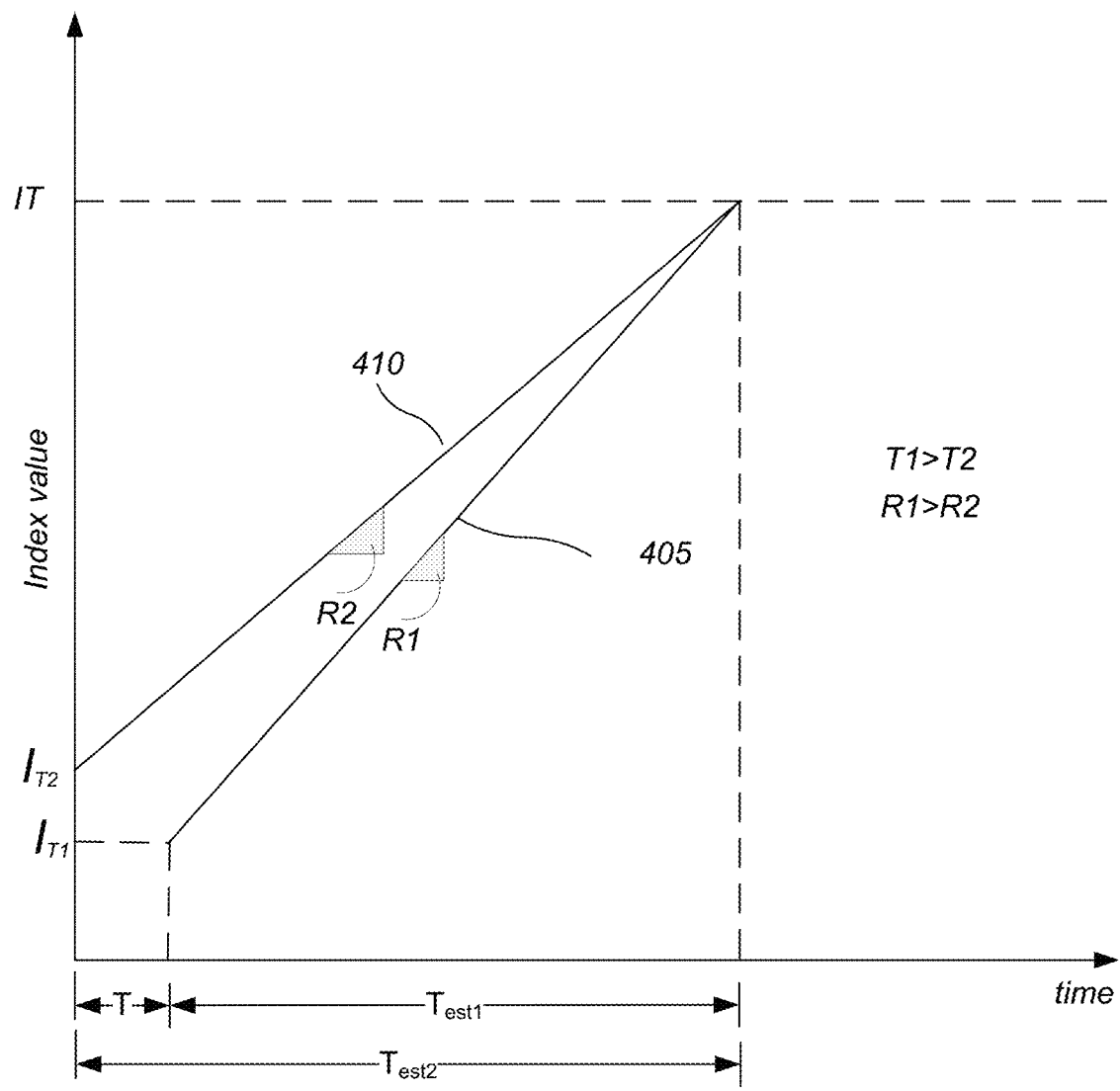
FIG. 12 illustrates a calculation of time offset between polish start-times of two substrates of differing thickness.

In some implementations, the initial thicknesses of two layers on the two substrates to be polished on the same platen can be different. In such cases, the polish time for the substrates with different thicknesses can be set or adjusted independently such that the polishing endpoints for the two substrates are substantially the same. Referring to FIG. 12, a plot of index as a function of time to illustrate an exemplary calculation of time offset between the polish start-times of two substrates of differing thickness. In this example, the line 405 represents an expected index line for a first substrate and the line 410 represents an expected index line for a second substrate as the substrates are polished to a desired target index IT. The pre-polish index value for the first substrate and the second substrate (corresponding to thicknesses T1 and T2, respectively) are In and In, respectively, while the target index for both substrates is IT. Even though the example in FIG. 12 shows a same target index for both substrates, in some implementations, each substrate can have a separate target index. In such cases, a first target index (or a first target thickness) and a second target index (or a second target thickness) can be stored and acted upon by the polishing apparatus. In general, the index value of a substrate has an inverse relationship with the thickness of the substrate. A higher index value typically corresponds to a smaller thickness. Therefore, in the present example, the thickness T1 of the first substrate is greater than the thickness T2 of the second substrate.

The thickness T1 and T2 can be measured by taking pre-polish measurements, and the corresponding index values can be calculated from such measurements. Measurement can be performed at a metrology system other than the optical monitoring system to be used during polishing, e.g., an in-line metrology station, such as a profilometer or optical metrology station that uses ellipsometry. "In-line" metrology refers to measurements made inside the cleanroom or inside a load lock or transfer chamber, whereas "in-situ"

metrology refers to measurements made inside a process chamber while the processing, e.g., polishing, is actually occurring.

A polishing rate is the rate at which material is removed from a substrate by polishing and is typically a function of the pressure applied via the polishing head, platen rotation rate, and slurry flow. Polishing rates (e.g. R1 and R2) can be represented as gradients of corresponding index lines. A higher gradient represents a faster polishing or removal rate while a smaller gradient represents a slower removal rate. For example, in FIG. 12, the polishing rate R1 corresponding to the first substrate is higher than the polishing rate R2 corresponding to the second substrate.

Based on the pre-polish thickness (or index value) of the substrate, the target index and a knowledge of a polishing rate, an expected required polish time can be calculated. In the example shown in FIG. 12, the expected required first polish time for polishing the first substrate can be calculated as:

$$T_{est1} = \frac{IT - I_{T1}}{R1}$$

Similarly, the expected required second polish time for the second substrate in this example can be calculated as:

$$T_{est2} = \frac{IT - I_{T2}}{R2}$$

If the target index for the two substrates are different, the above equations are modified by replacing the value of IT with appropriate target index values.

If the expected required polish time for one substrate is higher than the other, polishing of the latter substrate is started after a time offset with respect to the other substrate such that the expected polishing of the two substrates ends substantially simultaneously. In the current example, since $T_{est2} > T_{est1}$, the polishing of the first substrate is started after a time period following the start time for the second substrate. The difference in time between the expected required polish times of the two substrates can be represented as T. In the current example, the time period T can be calculated as:

$$T = T_{est2} - T_{est1}$$

In particular, although the two substrates may be on the same polishing pad simultaneously, for an initial time period T at the beginning of the polishing operation, no pressure is applied to the substrate having the lesser expected polishing time, while pressure is applied to the substrate having the greater expected polishing time. In contrast, after the initial time period T, pressure is applied to both substrates.

Figure 13:
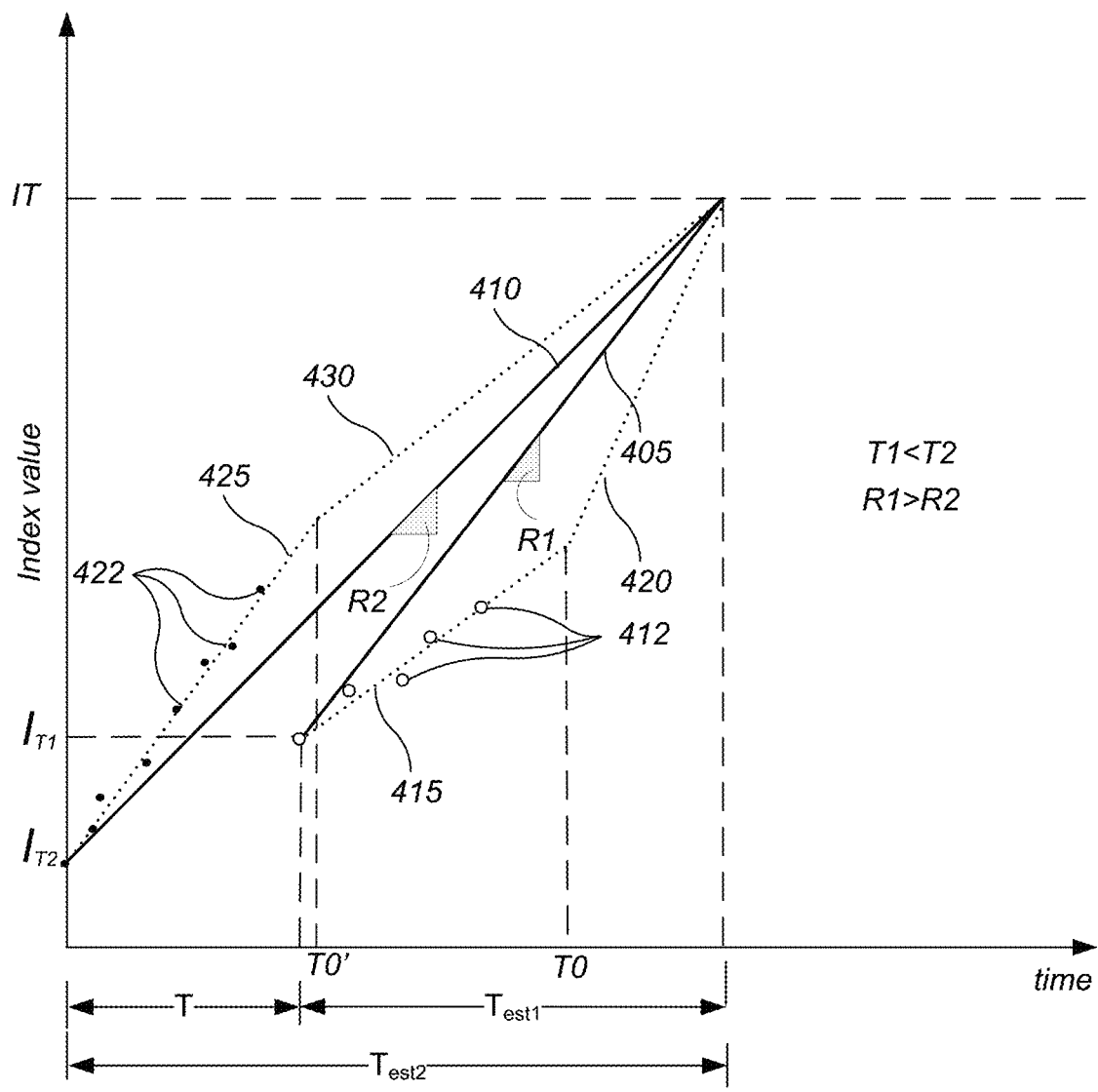
FIG. 13 illustrates a calculation of time offset between polish start-times of two substrates of differing thickness.

Referring now to FIG. 13, a plot illustrates an exemplary calculation of time offset between the polish start-times of two substrates where the polishing or removal rate R2 corresponding to the thicker (i.e. with a greater pre-polish thickness and lower pre-polish index value) substrate is less than the polishing rate R1 for the thinner (i.e. with a lower pre-polish thickness and higher pre-polish index value) substrate. In such cases, the calculated time offsets are typically large since the thinner substrate erodes relatively quickly to reach the target index.

For the situations in both FIGS. 12 and 13, the lines 405 and 410 are based on expected polishing rates that are usually known a priori based on earlier data (i.e., the expected polishing rate for a substrate is not based on data collected in-situ from that substrate during polishing). For example, in some implementations, an expected polishing rate can be the last known polishing rate for a given polishing head. An expected polishing rate can also be estimated by calculating an average or weighted average of multiple last known polishing rates. For example, the expected polishing rate can be determined by calculating a moving average of measured polishing rates of a plurality of substrates polished on the polishing pad before polishing of the first substrate and the second substrate.

In some implementations, the expected polishing rates for different substrates can be substantially the same. In such cases, the corresponding expected index lines are parallel and possibly coincident on each other if an appropriate delay in polishing is performed. Also, in such cases, the substrate with the thinner layer will be the one to which no pressure is applied during the initial time period T, while pressure is applied to the substrate with the thicker layer.

In some situations, the actual polishing rate can deviate from the expected or projected polishing rates. Therefore, in some implementations, an adjustment to a polishing parameters of at least one substrate can be performed during the polishing, e.g., as described above with reference to FIGS. 6-11. For example, the actual polishing rates can be measured, for example, by fitting lines on in situ measurements of index values. At an intermediate time (i.e. before the estimated end time) T0, the actual polishing rate for the first substrate can be measured by fitting a line 415 on the in situ measurements 412 of index values. If the actual or measured polishing rate is found to be deviating from the projected polishing rate, interim modifications can be made to ensure that the substrates reach their polishing end point simultaneously. For example, if the polishing rate corresponding to the first substrate is determined to be less than the projected polishing rate R1, the pressure on the corresponding polishing head can be increased such that the polishing rate is represented by the gradient of the line 420 and the entire polishing process for the first substrate is completed in time $T_{est1}$. The pressure adjustment can be applied a short time after the actual polishing rate is determined.

In some implementations, interim modifications can also be made for the second substrate. The actual polishing rate for the second substrate can be measured, for example at an intermediate time T0', by fitting a line 425 on the in situ measurements 422 of index values. If the slope of the line 425 is found to be different from the slope of the line 410, the actual polishing rate is determined to be deviated from the projected polishing rate and pressure adjustments can be done accordingly. In the example of FIG. 13, the actual polishing rate corresponding to the line 425 is more than the projected polishing rate R2. In such a case, the pressure on the polishing head can be reduced such that the entire polishing process of the second substrate is completed in time $T_{est2}$. In some implementations, the intermediate time points T0 and T0' can be made to coincide with each other. In such cases, the interim measurements and/or pressure adjustments on different substrates are performed simultaneously.

In some implementations, the pressure adjustment can also be done for only one of the substrates, e.g. the first substrate, while allowing the other substrate, e.g., the second substrate, to be polished at the corresponding actual polishing rate. In such a case, the pressure adjustment for the first substrate is made such that the corresponding endpoint converges on a revised estimated endpoint time calculated based on the actual polishing rate of the second substrate.

In some implementations, the pressure from the polishing heads are adjusted before the start of the polishing process such that the thickness of the substrates are substantially close to each other at a predetermined time point, e.g., the intermediate time T0 or at an estimated end time. For example, a pressure ratio of the polishing heads can be determined based on the expected required first polish time and the expected required second polish time. The pressure ratio can be determined such that the first substrate and the second substrate have closer to a same thickness at an estimated end time or an intermediate time than without such a pressure difference. In some implementations the pressure ratio between the polishing heads is substantially equal to the ratio between the expected required second polish time and the expected required first polish time and calculated as:

$$P_{ratio} = \frac{P_2}{P_1} = \frac{T_{est2}}{T_{est1}}$$

wherein $P_2$ and $P_1$ are the pressures applied to the heads corresponding to the second and first substrates, respectively. When a pressure ratio approach is used, the polishing of the two substrates are typically commenced together without a time offset T.

In some implementations, a combination of time offset and adjustment of the pressure from the carrier heads can be used. For example, a time offset T' can be selected that is greater than zero but less than the time offset T that would be calculated using the technique described above, i.e., $0<T'<T_{est2}-T_{est1}$. The pressure ratio can be selected to compensate for the remaining difference, e.g., the pressure ratio can be calculated as:

$$P_{ratio} = \frac{P_2}{P_1} = \frac{T_{est2} - T'}{T_{est1}}$$

Figure 14:
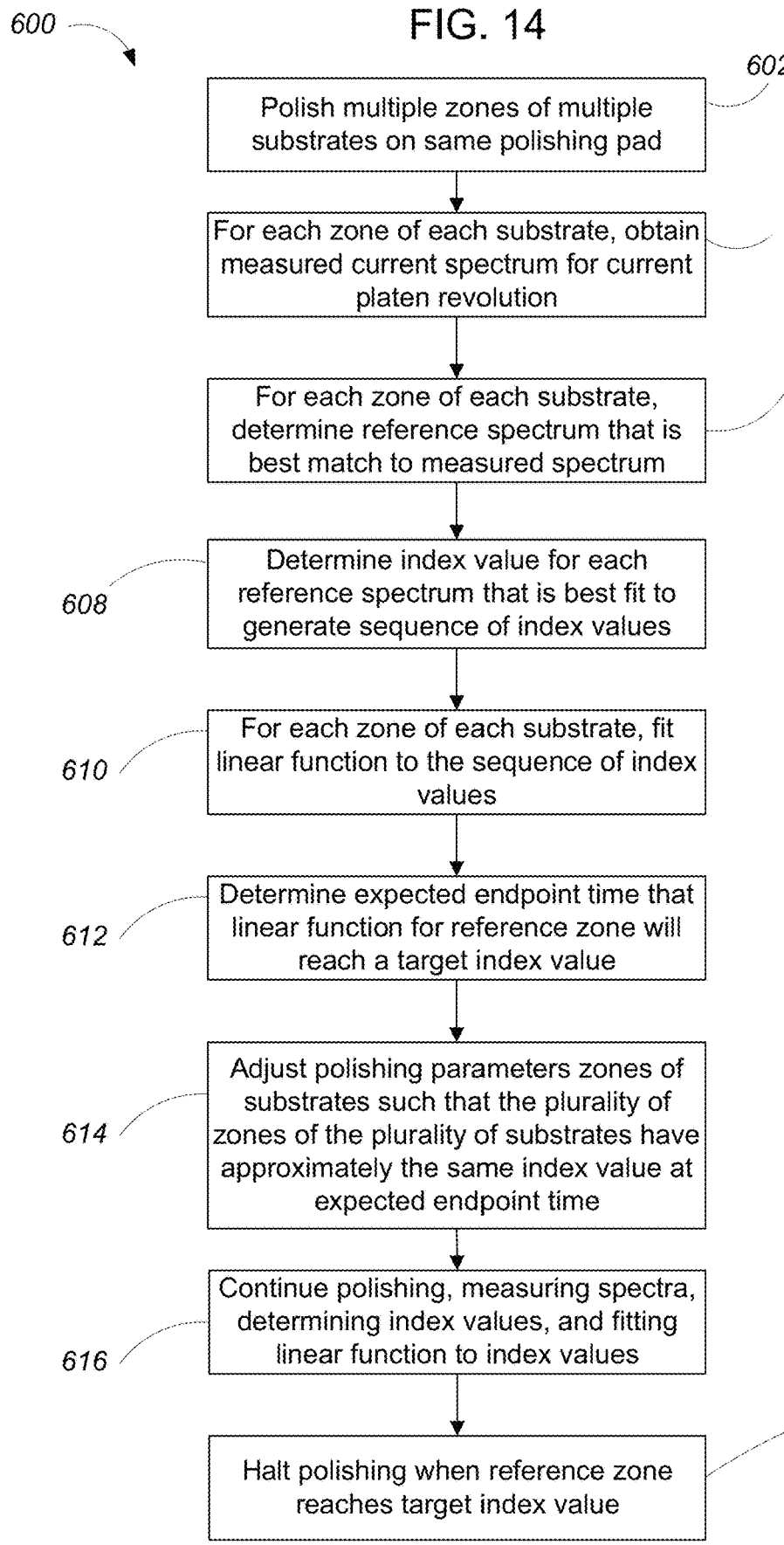
FIG. 14 is a flow diagram of an example process for adjusting the polishing rate of a plurality of zones in a plurality of substrates such that the plurality of zones have approximately the same thickness at the target time.

Referring to FIG. 14, a summary flow chart 600 is illustrated. A plurality of zones of a plurality of substrates are polished in a polishing apparatus simultaneously with the same polishing pad (step 602), as described above. During this polishing operation, each zone of each substrate has its polishing rate controllable independently of the other substrates by an independently variable polishing parameter, e.g., the pressure applied by the chamber in carrier head above the particular zone. During the polishing operation, the substrates are monitored (step 604) as described above, e.g., with a measured spectrum obtained from each zone of each substrate. The reference spectrum that is the best match is determined (step 606). The index value for each reference spectrum that is the best fit is determined to generate sequence of index values (step 610). For each zone of each substrate, a linear function is fit to the sequence of index values (step 610). In one implementation, an expected endpoint time that the linear function for a reference zone will reach a target index value is determined, e.g., by linear interpolation of the linear function (step 612). In other implementations, the expected endpoint time is predetermined or calculated as a combination of expected endpoint times of multiple zones. If needed, the polishing parameters for the other zones of the other substrates are adjusted to adjust the polishing rate of that substrate such that the plurality of zones of the plurality of substrates reach the target thickness at approximately the same time or such that the plurality of zones of the plurality of substrates have approximately the same thickness (or a target thickness) at the target time (step 614). Polishing continues after the parameters are adjusted, and for each zone of each substrate, measuring a spectrum, determining the best matching reference spectrum from a library, determining the index value for the best matching spectrum to generate a new sequence of index values for the time period after the polishing parameter has been adjusted, and fitting a linear function to index values (step 616). Polishing can be halted once the index value for a reference zone (e.g., a calculated index value generated from the linear function fit to the new sequence of index values) reaches target index (step 630).

The techniques described above can also be applicable for monitoring of metal layers using an eddy current system. In this case, rather than performing matching of spectra, the layer thickness (or a value representative thereof) is measured directly by the eddy current monitoring system, and the layer thickness is used in place of the index value for the calculations.

The method used to adjust endpoints can be different based upon the type of polishing performed. For copper bulk polishing, a single eddy current monitoring system can be used. For copper-clearing CMP with multiple wafers on a single platen, a single eddy current monitoring system can first be used so that all of the substrates reach a first breakthrough at the same time. The eddy current monitoring system can then be switched to a laser monitoring system to clear and over-polish the wafers. For barrier and dielectric CMP with multiple wafers on a single platen, an optical monitoring system can be used.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in a machine-readable storage media, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e. g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Particular embodiments of the invention have been described. Other embodiments are within the scope of the following claims.

What is claimed is:

1. A computer-implemented method of polishing, comprising:
    prior to polishing one or more substrates, measuring a plurality of thicknesses in a plurality of zones on the one or more substrates at an in-line metrology station;
    polishing the one or more substrates with a polishing pad, wherein pressures applied to the plurality of zones are independently controllable;
    determining a difference between a plurality of expected required polish times for the plurality of zones on the one or more substrates based on the plurality of thicknesses;
    determining a pressure ratio to apply between the plurality of zones on the one or more substrates using the difference such that the plurality of zones are calculated to have the same thickness at an intermediate time before a projected endpoint time for the plurality of zones under the applied pressure ratio; and
    at least until the intermediate time, applying pressures to the plurality of zones on the one or more substrates at the pressure ratio.

2. The method of claim 1, wherein the pressure ratio equals a ratio between the plurality of expected required polish times.

3. The method of claim 1, further comprising storing a plurality of target thickness for the plurality of zones of the one or more substrates.

4. The method of claim 3, further comprising subtracting the plurality of target thicknesses from plurality of thickness to determine a plurality of amounts to remove from the plurality of zones of the one or more substrates, and dividing the plurality of amounts to remove by a polishing rate to determine the plurality of expected required polishing times.

5. The method of claim 4, wherein the polishing rate is calculated prior to polishing of the one or more substrates.

6. The method of claim 1, further comprising:
    monitoring the one or more substrates during an initial period of polishing with an in-situ monitoring system;
    at a time after the initial period, adjusting a pressure of at least one zone of the plurality of zones of the one or more substrates such that the plurality of zones of the one or more substrates reach target thicknesses at closer to the same time than without such adjustment.

7. A computer program product, encoded on a non-transitory computer readable medium, comprising instructions to cause a controller of a polishing system to:
    receive from an in-line metrology station measurements of a plurality of thicknesses in a plurality of zones on one or more substrates prior to polishing of the one or more substrates;
    determine a difference between a plurality of expected required polish times for the plurality of zones on the one or more substrates based on the plurality of thicknesses;
    determine a pressure ratio to apply between the plurality of zones on the one or more substrates using the difference such that the plurality of zones are calculated to have the same thickness at an intermediate time before a projected endpoint time for the plurality of zones under the applied pressure ratio; and
    at least until the intermediate time, cause the polishing system to applying pressures to the plurality of zones on the one or more substrates at the pressure ratio.

8. The computer program product of claim 7, wherein the pressure ratio equals a ratio between the plurality of expected required polish times.

9. The computer program product of claim 7, further comprising instructions to store a plurality of target thickness for the plurality of zones of the one or more substrates.

10. The computer program product of claim 9, further comprising instructions to subtract the plurality of target thicknesses from plurality of thickness to determine a plurality of amounts to remove from the plurality of zones of the one or more substrates.

11. The computer program product of claim 10, further comprising instructions to determine the difference between a first expected required polish time and a second expected required polish time based on a polishing rate.

12. The computer program product of claim 10, wherein the instructions to determine the difference between the plurality of expected required polish times comprise instructions to divide the plurality of amounts to remove by a polishing rate to determine the plurality of expected required polishing times.

13. The computer program product of claim 12, comprising instructions to calculate the polishing rate prior to polishing of the one or more substrates.

14. The computer program product of claim 10, further comprising instructions to calculate a polishing rate by determining the polishing rate of at least one substrate polished on a polishing pad before polishing of the one or more substrates.

15. The computer program product of claim 14, wherein the instructions to determine the polishing rate comprise instructions to calculate a moving average of polishing rates of a plurality of substrates polished on the polishing pad before polishing of the one or more substrates.

16. The computer program product of claim 7, further comprising instructions to:
    receive measurements of the one or more substrates during an initial period of polishing from an in-situ monitoring system; and
    at a time after the initial period, adjust a pressure of at least one zone of the plurality of zones of the one or more substrates such that the plurality of zones of the one or more substrates reach target thicknesses at closer to the same time than without such adjustment.

* * * * *